(12) United States Patent
Lo et al.

(10) Patent No.: US 11,956,927 B2
(45) Date of Patent: Apr. 9, 2024

(54) CASE, FAN MODULE AND FAN FRAME

(71) Applicant: Wistron Corporation, New Taipei (TW)

(72) Inventors: Jen-Hsien Lo, New Taipei (TW); Wei-Hao Chen, New Taipei (TW); Sheng-Chieh Tsai, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 51 days.

(21) Appl. No.: 17/301,575

(22) Filed: Apr. 8, 2021

(65) Prior Publication Data
US 2022/0225543 A1    Jul. 14, 2022

(30) Foreign Application Priority Data

Jan. 13, 2021 (TW) .................................. 110101353

(51) Int. Cl.
*H05K 7/20* (2006.01)
*H05K 7/14* (2006.01)

(52) U.S. Cl.
CPC ....... *H05K 7/20727* (2013.01); *H05K 7/1487* (2013.01); *H05K 7/20172* (2013.01)

(58) Field of Classification Search
CPC ............. H05K 7/20727; H05K 7/1487; H05K 7/20172; G06F 1/183; G06F 1/184; G06F 1/20
See application file for complete search history.

(56) References Cited

U.S. PATENT DOCUMENTS 9,136,645 B1 * 9/2015 Yu ...................... H01R 12/7088
9,999,153 B1 * 6/2018 Peng .................... G11B 33/128
(Continued)

FOREIGN PATENT DOCUMENTS

TW         496548 U     7/2002
TW        M309777 U    4/2007
(Continued)

OTHER PUBLICATIONS

Wu, Li-Ren, "Power connector of heat dissipation fan", Apr. 11, 2007, Molex Taiwan LTD, Molex Inc., Entire Document (improved translation of TWM309777, of record, cited in the IDS, including Original Document and Translation). (Year: 2007).*

(Continued)

*Primary Examiner* — Stephen S Sul
(74) *Attorney, Agent, or Firm* — McClure, Qualey & Rodack, LLP (57) ABSTRACT

A case is provided, including a shell, a fan frame, and a fan module. The shell is internally provided with a backplane and a motherboard, where the motherboard is connected to the backplane along a first axis, the backplane is connected with a plug connector, the plug connector includes a plug connector body and a plurality of connection terminals, and the connection terminals are located in the plug connector body. The fan frame bears the fan module, and the fan module includes a fan assembly and a matching connector. The matching connector is connected to the fan assembly, and the matching connector is connected to the plug connector along a second axis. The matching connector includes a matching connector body and a plurality of matching terminals, and the matching terminals are located in the matching connector body. The fan frame is fixed in the shell.

4 Claims, 8 Drawing Sheets

(56) References Cited

U.S. PATENT DOCUMENTS

| | | | |
|---|---|---|---|
| 10,271,460 B2* | 4/2019 | Huang | H05K 7/20727 |
| 10,859,777 B2* | 12/2020 | Takai | G02B 6/4284 |
| 2009/0195978 A1* | 8/2009 | Hu | H05K 7/20727 |
| | | | 361/679.48 |
| 2011/0222227 A1* | 9/2011 | Xu | H05K 7/1487 |
| | | | 361/679.4 |
| 2011/0255238 A1* | 10/2011 | Tan | G06F 1/183 |
| | | | 361/679.48 |
| 2013/0200249 A1* | 8/2013 | Kuo | H05K 7/20727 |
| | | | 248/674 |
| 2013/0329371 A1* | 12/2013 | Lee | G06F 1/20 |
| | | | 361/724 |
| 2016/0053776 A1* | 2/2016 | Williams | G11B 33/142 |
| | | | 415/126 |
| 2016/0157380 A1 | 6/2016 | Kull et al. | |
| 2019/0227970 A1* | 7/2019 | Cheng | G06F 13/4282 |

FOREIGN PATENT DOCUMENTS

| | | | |
|---|---|---|---|
| TW | M333603 U | | 6/2008 |
| TW | 201352116 A | | 12/2013 |
| TW | 201500898 A | * | 1/2015 |
| TW | 201724667 A | * | 7/2017 |
| TW | 202002752 A | | 1/2020 |

OTHER PUBLICATIONS

Huang, Guan-Zhi; Zhang, Wen-Rong, "Wireless remote-controlled heat-dissipating device applied on mainboard", Jun. 1, 2008, Universal Scient Ind Co Ltd (improved translation of TWM333603, of record, cited in the IDS< including Original Document and Translation). (Year: 2008).*

Ding, Xiao-ning; Peng, Ping Wei, "Fan Connector Butt Joint Structure", Jul. 1, 2017, Inventec Corporation, Entire Document (translation of TW 201724667). (Year: 2017).*

Huang; Wen-Long, "Electronic Device", Jan. 1, 2015, Inventec Corp., Entire Document (Translation of TW 201500898) (Year: 2015).*

Examination report dated Apr. 28, 2022, listed in related Taiwan patent application No. 110101353.

* cited by examiner

CASE, FAN MODULE AND FAN FRAME

CROSS-REFERENCE TO RELATED APPLICATION

This non-provisional application claims priority under 35 U.S.C. § 119(a) to Patent Application No. 110101353 filed in Taiwan, R.O.C. on Jan. 13, 2021, the entire contents of which are hereby incorporated by reference.

BACKGROUND

Technical Field

A fan module, and in particular, a fan module loaded to a fan frame and applicable to a case are provided.

Related Art

In a conventional rack-mounted server system, there are a printed circuit board and a fan connected to the printed circuit board in a pluggable manner. A fan plug structure is located below the fan and is vertically plugged to a connector on the printed circuit board, and such a design occupies vertical space between the printed circuit board and the fan. As a result, a height that may be used in a server case is reduced.

When the printed circuit board is faulty, due to the fan plug structure, if the faulty printed circuit board needs to be taken out, operating of the entire system needs to be stopped, and the printed circuit board is taken out together with the fan and handled, or the printed circuit board is replaced after the fan above the printed circuit board is stopped and then taken out. However, these methods may affect heat dissipation performance of the fan on front and rear channels that may be cooled by the fan originally. As a result, system performance is reduced.

SUMMARY

In view of this, according to some embodiments, a fan module is provided, including a fan assembly and a matching connector located on a side edge of the fan assembly and connected to the fan assembly, the matching connector including a matching connector body and a plurality of matching terminals, the matching terminals being located in the matching connector body and one side of each of the matching terminals being exposed from one side of the matching connector body.

In some embodiments, the matching connector further includes a guiding portion, and the guiding portion is located in the matching connector body.

In some embodiments, the fan assembly further includes a bearing piece and a bearing platform, the bearing piece is fixed to the side edge of the fan assembly, the bearing platform protrudes out from one side of the bearing piece, and the matching connector is fixed to the bearing platform.

In some embodiments, the matching connector body further includes a matching end and an opposite end, the matching end and the opposite end are two ends opposite to each other, the matching terminals and the guiding portion are exposed from the matching end, and the opposite end is fixed to the bearing platform and connected to the fan assembly.

In some embodiments, a width of each of the matching terminals is less than a width of the guiding portion.

In some embodiments, the width of the guiding portion is 2.5 mm to 3.0 mm.

In some embodiments, the fan assembly further includes a bearing piece, a bearing platform, and an adapter plate, the bearing piece is fixed to the side edge of the fan assembly, the bearing platform protrudes out from one side of the bearing piece, the adapter plate is fixed to the bearing platform, and the matching connector and a clamping connector are fixed to the adapter plate.

In some embodiments, the clamping connector includes a clamping connector body and a plurality of clamping terminals, the clamping terminals are located in the clamping connector body and one side of each of the clamping terminals is exposed from one side of the clamping connector body, and an extending direction of the clamping terminals is perpendicular to an extending direction of the matching terminals.

According to some embodiments, a case is provided, including a shell, a fan frame, and a fan module. The shell is internally provided with a backplane and a motherboard, where the motherboard is connected to the backplane along a first axis, the backplane is connected with a plug connector, the plug connector includes a plug connector body and a plurality of connection terminals, and the connection terminals are located in the plug connector body. The fan frame is fixed in the shell and located on one side of the motherboard. The fan module is located in the fan frame, the fan module includes a fan assembly and a matching connector, and the matching connector is located on a side edge of the fan assembly and connected to the fan assembly; and the matching connector includes a matching connector body and a plurality of matching terminals, and the matching terminals are located in the matching connector body. The matching connector is connected to the plug connector along a second axis.

In some embodiments, the plug connector further includes a plurality of sockets and a matching portion, the connection terminals are disposed in the sockets, and the matching portion is located in the plug connector body; and the matching connector further includes a guiding portion, and the guiding portion is located in the matching connector body.

In some embodiments, the plug connector body further includes a fixing end and a connecting end, the fixing end and the connecting end are two ends opposite to each other, and the sockets and the matching portion are disposed at the connecting end; and the matching connector body further includes a matching end and an opposite end, the matching end and the opposite end are two ends opposite to each other, the matching terminals and the guiding portion are exposed from the matching end, and the opposite end is fixed to the bearing platform and connected to the fan assembly.

In some embodiments, a width of each of the sockets is less than a width of the matching portion, a width of each of the matching terminals is less than a width of the guiding portion, the guiding portion is a guiding piece, the width of the socket is approximately equal to the width of the matching terminal, and the width of the guiding portion is approximately equal to the width of the matching portion.

In some embodiments, the fixing end further includes a plurality of fixing terminals, the fixing terminals are exposed from the fixing end, and the plug connector is fixed to the backplane of the shell through the fixing terminals.

In some embodiments, the fan frame further includes a support structure, and the support structure is located on a bottom side of the fan frame.

In some embodiments, the fan frame further includes a plurality of partition plates separating the fan frame into a plurality of accommodation spaces.

In some embodiments, the fan assembly further includes a bearing piece, a bearing platform, and an adapter plate, the bearing piece is fixed to the side edge of the fan assembly, the bearing platform protrudes out from one side of the bearing piece, the adapter plate is fixed to the bearing platform, and the matching connector and a clamping connector are fixed to the adapter plate.

In some embodiments, the clamping connector includes a clamping connector body and a plurality of clamping terminals, the clamping terminals are located in the clamping connector body and one side of each of the clamping terminals is exposed from one side of the clamping connector body, and an extending direction of the clamping terminals is perpendicular to an extending direction of the matching terminals.

According to some embodiments, a fan frame is provided, including a fan frame body and a matching connector. The matching connector is located on a side edge of the fan frame body and is adapted to connect to a fan module; and the matching connector includes a matching connector body, a plurality of matching terminals, and a guiding portion, the matching terminals are located in the matching connector body and one side of each of the matching terminals is exposed from the matching connector body, and the guiding portion is located in the matching connector body.

Based on the above, according to some embodiments, by disposing a plug connector on an upright backplane in a case and disposing a matching connector on a side edge of a fan module, a user may unplug the fan module from or plug the fan module into a fan frame through a side edge of the backplane and in parallel to the backplane, to separate or connect the plug connector and the matching connector. A motherboard located below the fan module and the fan module are independent of each other, the motherboard may be individually dismounted or mounted, namely, unplugged from or plugged into the backplane, so that the fan module and the motherboard may be plugged or unplugged independently of each other, and operating of the fan module is not affected when the motherboard is repaired.

DETAILED DESCRIPTION

Figure 1:
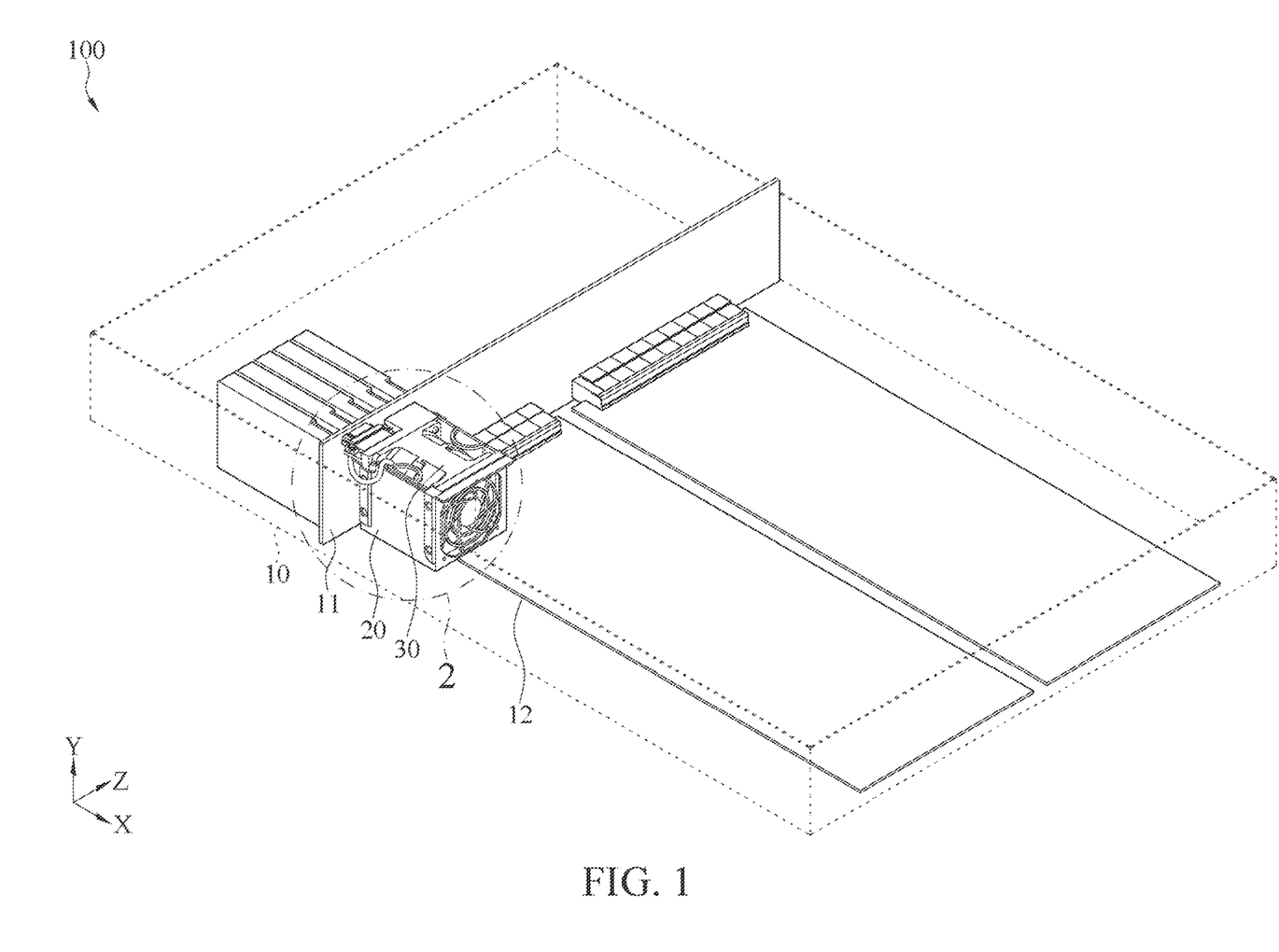
FIG. 1 shows a three-dimensional diagram of a case in a state of mounting a single fan module on a single fan frame according to some embodiments.

Referring to FIG. 1, a case 100 includes a shell 10, a fan frame 20, and a fan module 30.

In some embodiments, the case 100 is a rack-mounted server system, the fan module 30 is borne by the fan frame 20, and the fan module 30 is, for example, but is not limited to a fan with a model 6056, where a size of the fan with the model 6056 is 60 mm*60 mm*56 mm. A height of the rack-mounted server uses U as a unit (1 U is equal to 1.75 inches and equal to 44.45 mm), and generally, there are servers with several standards of 1 U to 7 U. In some embodiments, the case 100 is sleeved on a 2 U server, and according to this design manner, some space below the fan module 30 may be spared for other applications, such as a departure walk of a motherboard or a design for another structure. The fan module 30 may exhaust heat air generated when elements (for example, a CPU and a front-facing SSD) in the case 100 operate, to perform heat dissipation.

In some embodiments, the fan module 30 is an independent kit (which may be described in detail below), and the case 100 may include one or more fan modules 30 (as shown in FIG. 1). In some embodiments, the fan frame 200 is an independent kit (which may be described in detail below) and may fit cases with different sizes, such as rack-mounted servers with different heights, and may also bear fan modules with different sizes and specifications.

Figure 2:
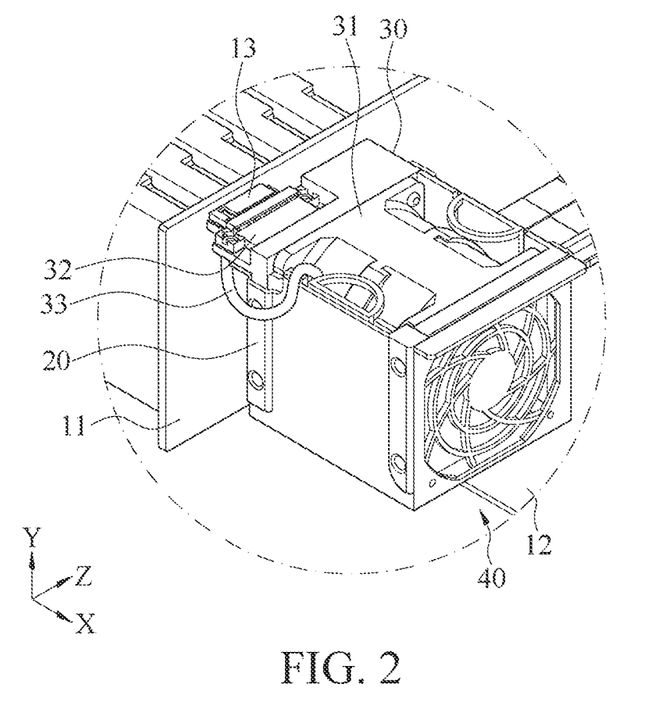
FIG. 2 shows a schematic enlarged view of a centerline frame of a mark 2 in FIG. 1.
Figure 3:
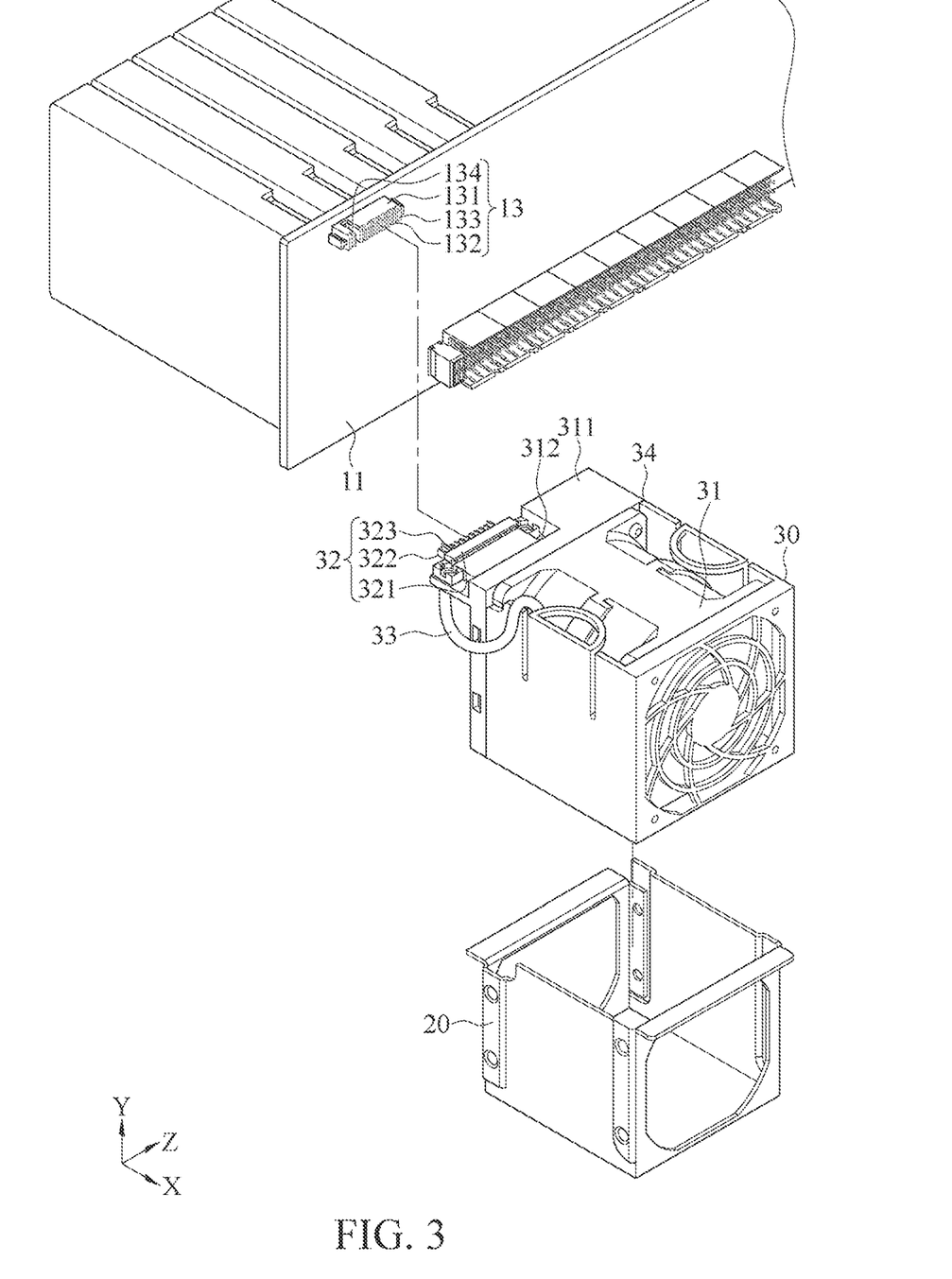
FIG. 3 shows a schematic exploded view of a fan module, a backplane, and a fan frame according to some embodiments.

Referring to FIG. 1, FIG. 2, and FIG. 3, a backplane 11 and a motherboard 12 that are matched to each other are mounted in the shell 10. The backplane 11 is connected with a plug connector 13, the plug connector 13 includes a plug connector body 131 and a plurality of connection terminals 133. The connection terminals 133 are located in the plug connector body 131 and one side of each of the connection terminals 133 is exposed from one side of the plug connector body 131. In some embodiments, the backplane 11 is upright in a vertical direction (a second axis Y) of the case, and the motherboard 12 is horizontally placed in a horizontal direction (a first axis X) of the case, so that the backplane 11 and the motherboard 12 are orthogonal. In some embodiments, the plug connector 13 may be a receptacle-type electrical connector or a plug-type electrical connector.

The fan frame 20 is fixed in the shell 10 and located on one side of the motherboard 12. In some embodiments, the fan frame 20 is fixed to a side wall of the shell 10 in a locking, soldering, or riveting manner, and an operation space 40 for mounting the motherboard 12 is formed from a bottom side of the fan frame 20 to a bottom side of the shell 10. In some embodiments, the motherboard 12 may be dismounted or mounted along the first axis X.

In some embodiments, the fan frame 20 bears the fan module 30. The fan module 30 includes a fan assembly 31 and a matching connector 32, the matching connector 32 is located on a side edge of the fan assembly 31 and is connected to the fan assembly. The matching connector 32 includes a matching connector body 321 and a plurality of matching terminals 322, the matching terminals 322 are located in the matching connector body 321 and one side of each of the matching terminals 322 is exposed from one side of the matching connector body 321. In some embodiments, the fan assembly 31 and the matching connector 32 are connected to each other and transmit signals by using a signal line 33. In some embodiments, the matching connector 32 may be a receptacle-type electrical connector or a plug-type electrical connector.

Figure 4:
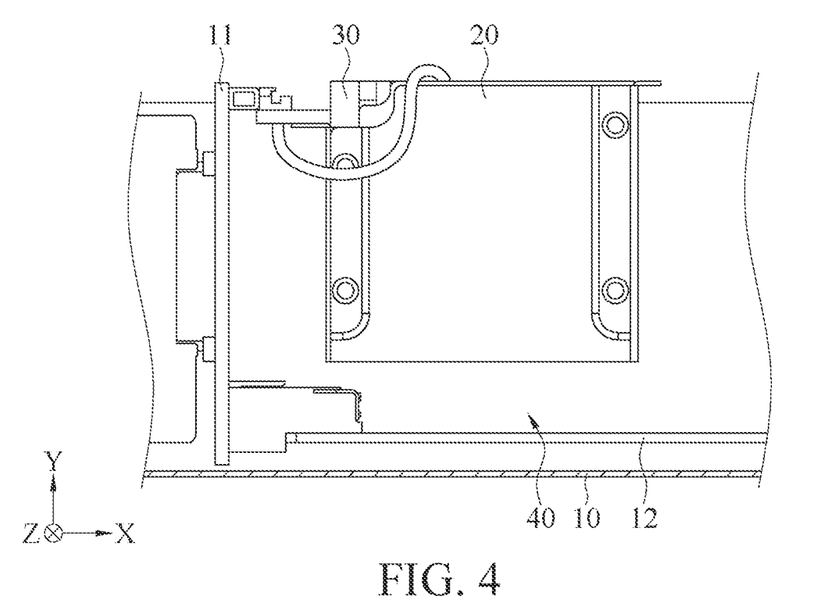
FIG. 4 shows a schematic local side view of the case in a state of connecting a motherboard to a backplane according to some embodiments.
Figure 5:
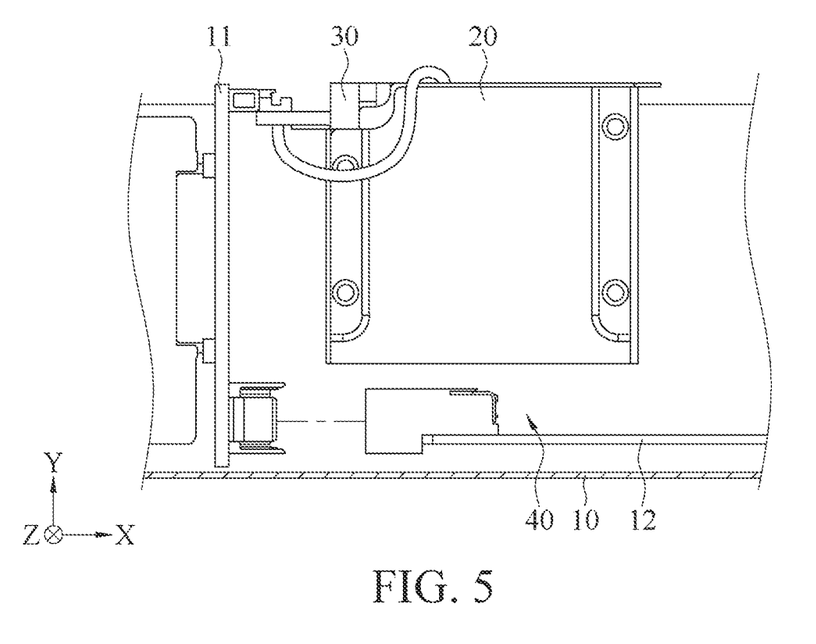
FIG. 5 shows a schematic local side view of the case in a state of dismounting a motherboard according to some embodiments.

Referring to FIG. 2 and FIG. 3, in some embodiments, the plug connector 13 and the matching connector 32 are designed correspondingly. Specifically, the plug connector 13 is a receptacle-type electrical connector, the matching connector 32 is a plug-type electrical connector, the plug connector 13 is female, the matching connector 32 is male, and the connection terminals 133 and the matching terminals 322 may be connected to each other correspondingly and transmit signals. In some embodiments, when the matching connector 32 and the plug connector 13 are connected to each other, the fan module starts to operate and exhausts heat air generated by the operating of the elements. In some embodiments, when the fan module 30 is dismounted or mounted, as shown in FIG. 3, the plug connector 13 is fixed to the upright backplane 11, and the matching connector 32 is located on one side of the fan assembly 31, so that a user may vertically unplug the fan module 30 from or plug the fan module into the fan frame 20 through a side edge of the backplane 11 along the second axis Y. Referring to FIG. 4 and FIG. 5, in some embodiments, there is a gap between the bottom side of the fan frame 20 and the bottom side of the shell 10, and the gap forms the operation space 40. As shown in FIG. 5, when the motherboard 12 is dismounted or mounted, the user may horizontally dismount or mount the motherboard 12 along the first axis X in the operation space 40 without dismounting the fan module 30 first.

Figure 6:
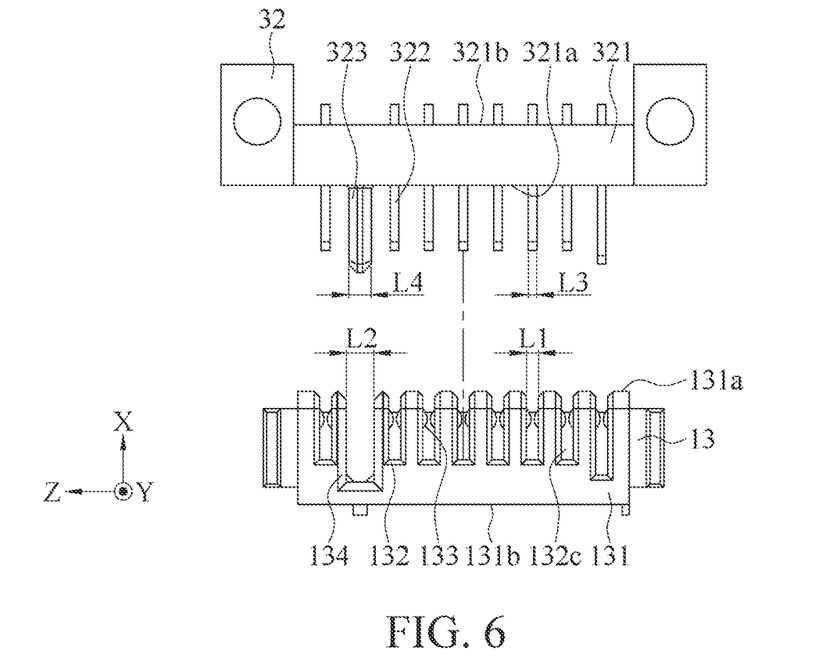
FIG. 6 shows a top view of a plug connector and a matching connector in a state of separating the plug connector and the matching connector according to some embodiments.

Referring to FIG. 2 and FIG. 3 again, in some embodiments, the plug connector 13 further includes a plurality of sockets 132 and a matching portion 134, the connection terminals 133 are disposed in the sockets 132, and the matching portion 134 is located in the plug connector body 131; and the matching connector 32 further includes a guiding portion 323, and the guiding portion 323 is located in the matching connector body 321. In some embodiments, the plurality of sockets 132 are disposed in the plug connector body 131 along a third axis Z, and the connection terminals 133 are disposed in the sockets 132. In some embodiments, the matching portion 134 is a concave portion, and the matching portion 134 is, for example, located between a plurality of sockets 132 at the outermost side. That is, the matching portion 134 is disposed between two sockets 132 at a side edge (the outermost side) of a plurality of sockets 132 of the same row (as shown in FIG. 6), but is not limited thereto. Alternatively, the matching portion 134 may be adjacent to at least one socket 132 of the sockets 132. That is, the matching portion may be disposed at a side edge of one socket 132 at a side edge (the outermost side) of the plurality of sockets 132 of the same row. In some embodiments, the guiding portion 323 is a protrusion, the guiding portion 323 is exposed from one side of the matching connector body 321, and the guiding portion 323 is located between the matching terminals 322 at the outermost side, or the guiding portion 323 may be adjacent to at least one matching terminal 322 of the matching terminals 322. Based on the above, in some embodiments, the matching terminals 322 may be clamped to the sockets 132 correspondingly along the second axis Y, and the matching terminals and the connection terminals 133 may be connected to each other and transmit signals. The guiding portion 323 of the matching connector 32 may be positioned to the matching portion 134 of the plug connector 13, to assist the plug connector 13 in matching with the matching connector 32. In some embodiments, the plug connector 13 is male, and the matching connector 32 is female. For example, the matching connector 32 is provided with sockets and a concave portion for clamping and alignment of the connection terminals 133 and a protrusion of the plug connector 13.

Referring to FIG. 3 again, in some embodiments, the fan assembly 31 further includes a bearing piece 311 and a bearing platform 312, the bearing piece 311 is fixed to the side edge of the fan assembly 31, the bearing platform 312 protrudes out from one side of the bearing piece 311, and the matching connector 32 is fixed to the bearing platform 312. In some embodiments, the bearing piece 311 is fixed to an air exhaust side 34 of the fan assembly 31, and the air exhaust side 34 is a side facing the backplane 11. In some embodiments, the bearing platform 312 extends toward one side of the backplane 11 from the bearing piece 311, and the matching connector 32 is fixed to the bearing platform 312. In some embodiments, the matching connector 32 is fixed to an upper side of the bearing platform 312, and the matching terminals 322 of the matching connector 32 extend toward one side of the backplane 11 from one side of the matching connector body 321 and extend beyond the bearing platform 312, so that the matching connector 32 may be vertically clamped to the plug connector 13 from the above of the plug connector 13 through the air exhaust side 34 of the fan assembly 31.

Figure 7:
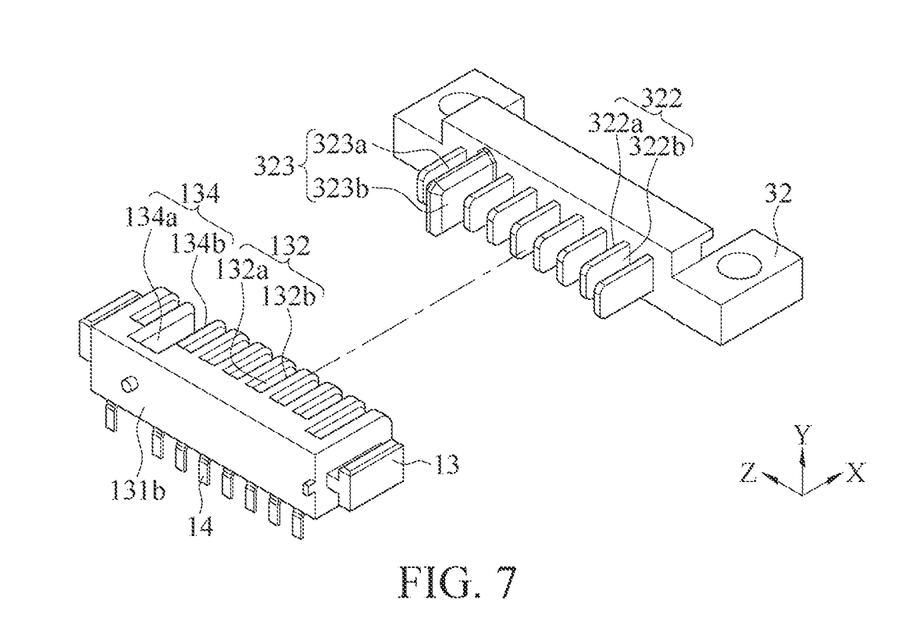
FIG. 7 shows a three-dimensional diagram of a plug connector and a matching connector in a state of separating the plug connector and the matching connector according to some embodiments.

Referring to FIG. 6 and FIG. 7, in some embodiments, the plug connector body 131 further includes a connecting end 131a and a fixing end 131b, the connecting end 131a and the fixing end 131b are two ends opposite to each other, and the sockets 132 and the matching portion 134 are disposed at the connecting end 131a. The matching connector body 321 further includes a matching end 321a and an opposite end 321b, the matching end 321a and the opposite end 321b are two ends opposite to each other, the matching terminals 322 and the guiding portion 323 are exposed from the matching end 321a, and the opposite end 321b is fixed to the bearing platform 312 and connected to the fan assembly 31. In some embodiments, the opposite end 321b of the matching connector 32 may be fixed to the bearing platform 312 in a locking, soldering, or riveting manner, and the matching connector 32 is connected to the fan assembly 31 from the opposite end 321b by using the signal line 33. The fan assembly 31 and the matching connector 32 are connected to each other and transmit signals by using the signal line 33, and the fixing end 131b of the plug connector 13 may be fixed to the backplane 11 in a locking, soldering, or riveting manner.

As shown in FIG. 6, in some embodiments, each of the sockets 132 is provided with a first width L1, the matching portion 134 is provided with a second width L2, and the second width L2 is greater than the first width L1. Each of the matching terminals 322 is provided with a third width L3, the guiding portion 323 is a guiding piece, the guiding portion 323 is provided with a fourth width L4, and the fourth width L4 is greater than the third width L3. The third width L3 is approximately equal to the first width L1, and the fourth width L4 is approximately equal to the second width L2. The "approximately equal" herein means that the length may have a tolerance/allowance range. In some embodiments, the matching terminals 322 and the sockets 132 are provided with corresponding sizes to make the matching terminals and the sockets clamped to each other. To make the matching connector 32 aligned to the plug connector 13, a size of the guiding portion 323 and a size of the matching portion 134 are increased, and the matching terminals 322 are clamped to the sockets 132 by aligning the guiding portion 323 to the matching portion 134. In some embodiments, the width of the guiding portion 323 is 2.5 mm to 3.0 mm. In some embodiments, each of the matching terminals 322 of the matching connector 32 has a relatively high tolerance/allowance, which may reduce a risk of bending pins when a fan is plugged or unplugged.

As shown in FIG. 6 and FIG. 7, in some embodiments, each of the matching terminals 322 is in a shape of a leaf or a blade. In some embodiments, each of the matching terminals 322 is in a shape of a hay cutter and includes a first side surface 322a and a second side surface 322b, and the first side surface 322a and the second side surface 322b are surfaces opposite to each other. Each of the sockets 132 includes a first side wall 132a, a second side wall 132b and a bearing surface 132c, the first side wall 132a and the second side wall 132b are surfaces opposite to each other, and the bearing surface 132c is matched to the first side wall 132a and the second side wall 132b respectively. In some embodiments, each of the connection terminals 133 is disposed on the first side wall 132a and the second side wall 132b of each of the sockets 132. In some embodiments, a structure of each of the sockets 132 corresponds to a structure of each of the matching terminals 322, so that the matching terminals may be clamped to the sockets correspondingly. The first width L1 from the first side wall 132a to the second side wall 132b is approximately equal to the third width L3 from the first side surface 322a to the second side surface 322b, and the bearing surfaces 132c of the sockets 132 may bear the matching terminals 322. In some embodiments, the guiding portion 323 includes a third side surface 323a and a fourth side surface 323b, and the third side surface 323a and the fourth side surface 323b are surfaces opposite to each other. The matching portion 134 includes a third side wall 134a and a fourth side wall 134b, and the third side wall 134a and the fourth side wall 134b are surfaces opposite to each other. In some embodiments, a structure of the matching portion 134 corresponds to a structure of the guiding portion 323, and the second width L2 from the third side wall 134a to the fourth side wall 134b is approximately equal to the fourth width L4 from the third side surface 323a to the fourth side surface 323b.

Referring to FIG. 2 and FIG. 7, in some embodiments, the fixing end 131b of the plug connector 13 further includes a plurality of fixing terminals 14, the fixing terminals 14 are exposed from one side of the fixing end 131b, and the plug connector 13 is connected to the backplane 11 of the shell 10 through the fixing terminals 14. In some embodiments, an extending direction of the fixing terminals 14 is parallel to the backplane 11, and the fixing terminals extend vertically. The fixing terminals 14 may be fixed to the backplane 11 in a soldering manner and connected to the backplane to transmit signals. In some embodiments, specifically, the backplane 11 transmits signals to the plug connector 13 through the fixing terminals 14, then transmits signals to the matching terminals 322 of the matching connector 32 through the connection terminals 133, and transmits signals to the fan assembly 31 through the signal line 33.

In some embodiments, a protruding direction of the fixing terminals 14 is perpendicular to the backplane 11, and the fixing terminals extend horizontally. The backplane 11 is provided with a plurality of holes, the fixing terminals 14 are plugged into the holes of the backplane 11 in an embedding manner, and the fixing terminals are connected to the backplane to transmit signals.

Figure 8:
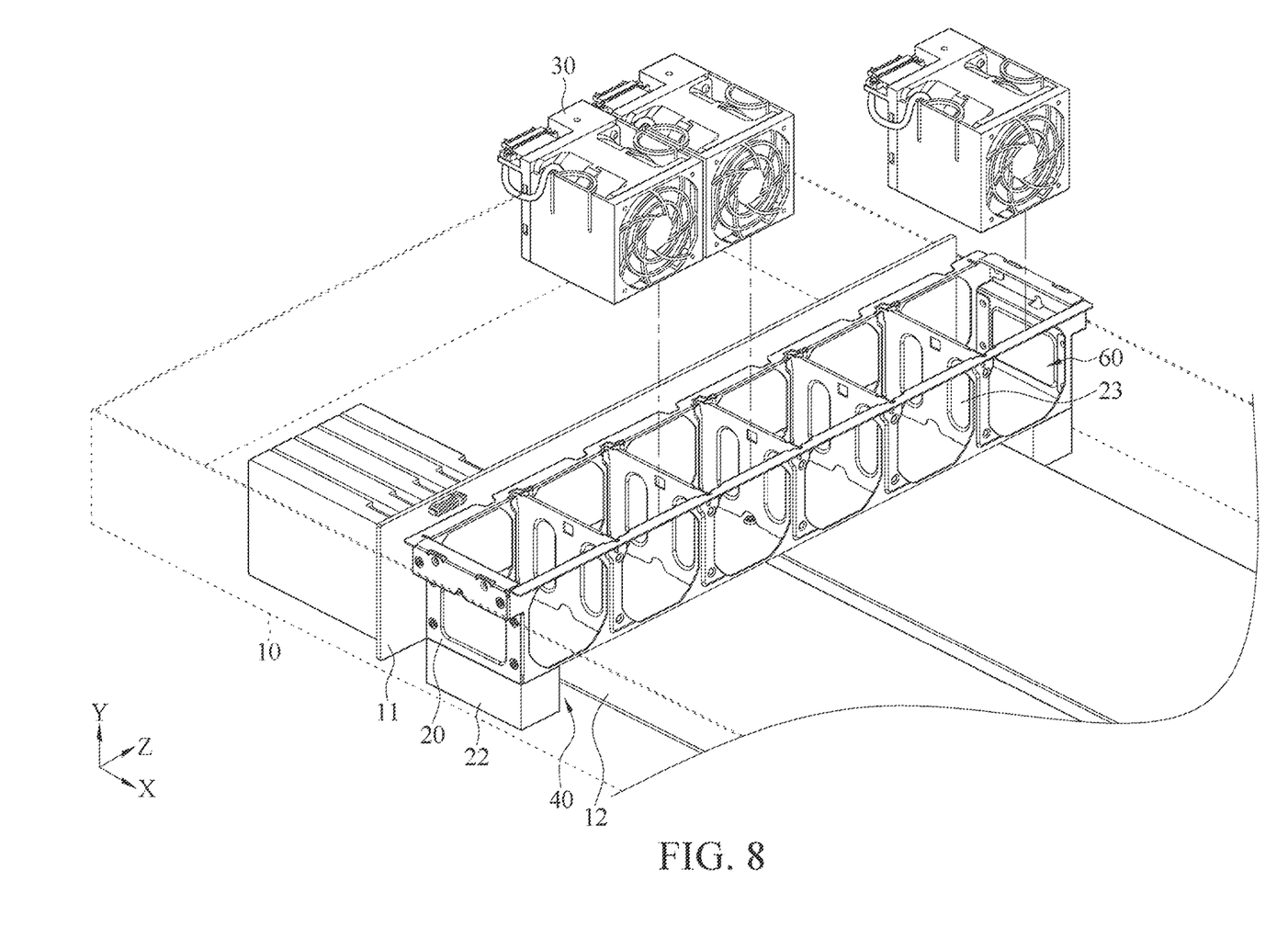
FIG. 8 shows a schematic three-dimensional diagram of another case in a state that a plurality of fan modules may be mounted on a single fan frame according to some embodiments.

Referring to FIG. 8, in some embodiments, the fan frame 20 may include a support structure 22, and the support structure 22 is located between the fan frame 20 and the shell 10. In some embodiments, the support structure 22 is fixed to the bottom side of the fan frame 20 or the shell 10 in a locking, soldering, or riveting manner. The support structure 22 is located in the operation space 40 between the bottom side of the fan frame 20 and the bottom side of the shell 10 and located on two sides of the motherboard 12, so as to provide strength to support the fan frame 20 and not to interfere with the dismounting or mounting of the motherboard 12.

Referring to FIG. 1 and FIG. 8, in some embodiments, the fan frame 20 may include a plurality of partition plates 23, separating or arranging the fan frame 20 into a plurality of accommodation spaces 60 along the third axis Z. In some embodiments, as shown in FIG. 1, one or more fan frames 20 may be disposed according to the shell 10 to mount required fan modules 30. Alternatively, as shown in FIG. 8, one fan frame 20 may be disposed in the shell 10, and the fan frame 20 is separated into a plurality of accommodation spaces 60 by using a plurality of partition plates 23 to mount a plurality of fan modules 30.

Figure 9:
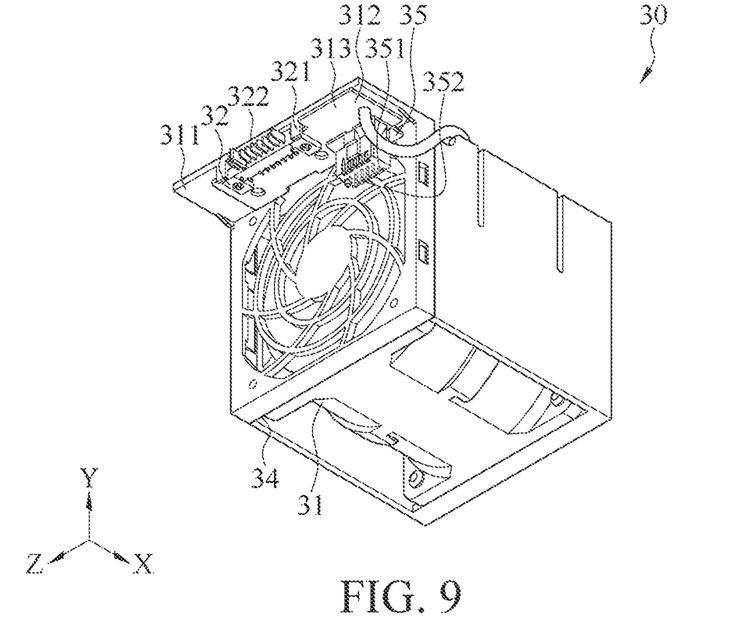
FIG. 9 shows a schematic three-dimensional diagram of another embodiment of a fan module provided with an adapter plate according to some embodiments.

Referring to FIG. 9, the fan assembly 31 may include a bearing piece 311, a bearing platform 312, and an adapter plate 313. The bearing piece 311 is fixed to the side edge of the fan assembly 31, the bearing platform 312 protrudes out from one side of the bearing piece 311, the adapter plate 313 is fixed to the bearing platform 312, and the matching connector 32 and a clamping connector 35 are fixed to the bearing platform 312. In some embodiments, the bearing piece 311 is fixed to the air exhaust side 34 of the fan assembly 31 in a locking, soldering, or riveting manner, and the air exhaust side 34 is a side facing the backplane 11.

In some embodiments, the bearing platform 312 extends toward one side of the backplane 11 from the bearing piece 311. The adapter plate 313 is fixed to a lower side of the bearing platform 312 in a locking, soldering, or riveting manner and is connected to the fan assembly 31 through the signal line 33 to transmit signals. In some embodiments, the matching connector 32 is fixed to the adapter plate 313 in a locking, soldering, or riveting manner, and the matching terminals 322 of the matching connector 32 extend toward one side of the backplane 11 from one side of the matching connector body 321 and extend beyond the bearing platform 312, so that the matching connector 32 may be vertically clamped to the plug connector 13 from the above of the plug connector 13 through the air exhaust side 34 of the fan assembly 31.

In some embodiments, a clamping connector 35 is further fixed to the adapter plate 313. The clamping connector includes a clamping connector body 351 and a plurality of clamping terminals 352, the clamping terminals 352 extend outward from one side of the clamping connector body 351, and an extending direction of the clamping terminals 352 is perpendicular to an extending direction of the matching terminals 322. In some embodiments, the matching connector 32 and the clamping connector 35 may be interchanged for use, and in order to fit connectors with different forms or structures, signals may alternatively be transmitted by clamping the upright clamping terminals 352 of the clamping connector 35 to a connector with a corresponding structure.

Figure 10:
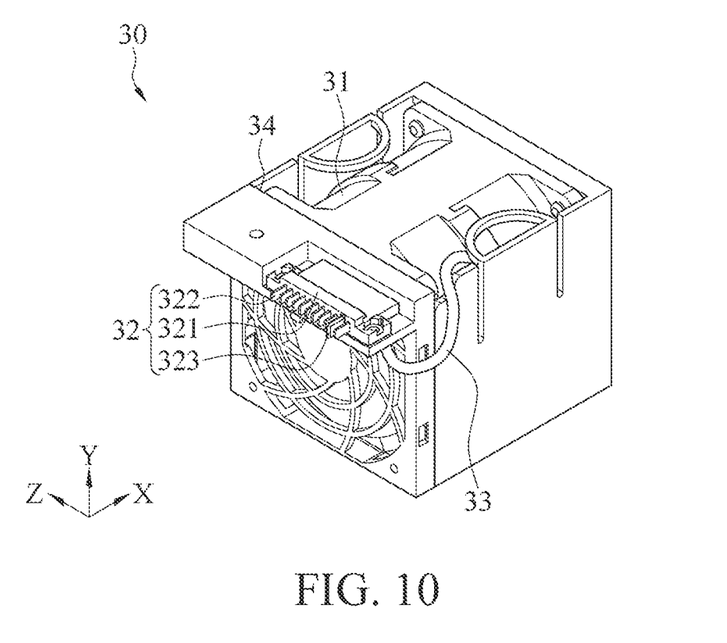
FIG. 10 shows a schematic three-dimensional diagram of a single fan module according to some embodiments.

Referring to FIG. 10, a fan module 30 is provided. The fan module includes a fan assembly 31 and a matching connector 32, the matching connector 32 is located on a side edge of the fan assembly 31 and is connected to the fan assembly. The matching connector 32 includes a matching connector body 321 and a plurality of matching terminals 322, the matching terminals 322 are located in the matching connector body 321 and one side of each of the matching terminals 322 is exposed from one side of the matching connector body 321. In some embodiments, one side of each of the plurality of matching terminals 322 is located on one side of the matching connector body 321 along a third axis Z. In some embodiments, the matching connector 32 includes a guiding portion 323, and the guiding portion 323 is located in the matching connector body 321. In some embodiments, the guiding portion 323 is, for example, located between two matching terminals 322 at a side edge (the outermost side) of a plurality of matching terminals 322 of the same row (as shown in FIG. 6), but is not limited thereto. The guiding portion 323 may alternatively be adjacent to at least one matching terminal 322 of the matching terminals 322. In some embodiments, the guiding portion 323 may be a protrusion or a concave portion. Specifically, the matching connector 32 may be male or may be female. That is, the matching connector 32 may be a plug-type electrical connector or a receptacle-type electrical connector to fit a corresponding receptacle-type electrical connector or plug-type electrical connector.

In some embodiments, the fan module 30 is adapted to fit the foregoing case 100 or another type of case, and one fan module 30 or more fan modules 30 are disposed. In some embodiments, the fan assembly 31 and the matching connector 32 are connected to each other and transmit signals through the signal line 33. In some embodiments, the matching connector 32 is male and is a connector disposed and adapted to fit the foregoing case 100 or another type of case, and the matching connector is clamped to a connector of a corresponding structure by using the matching terminals 322 to transmit signals.

Figure 11:
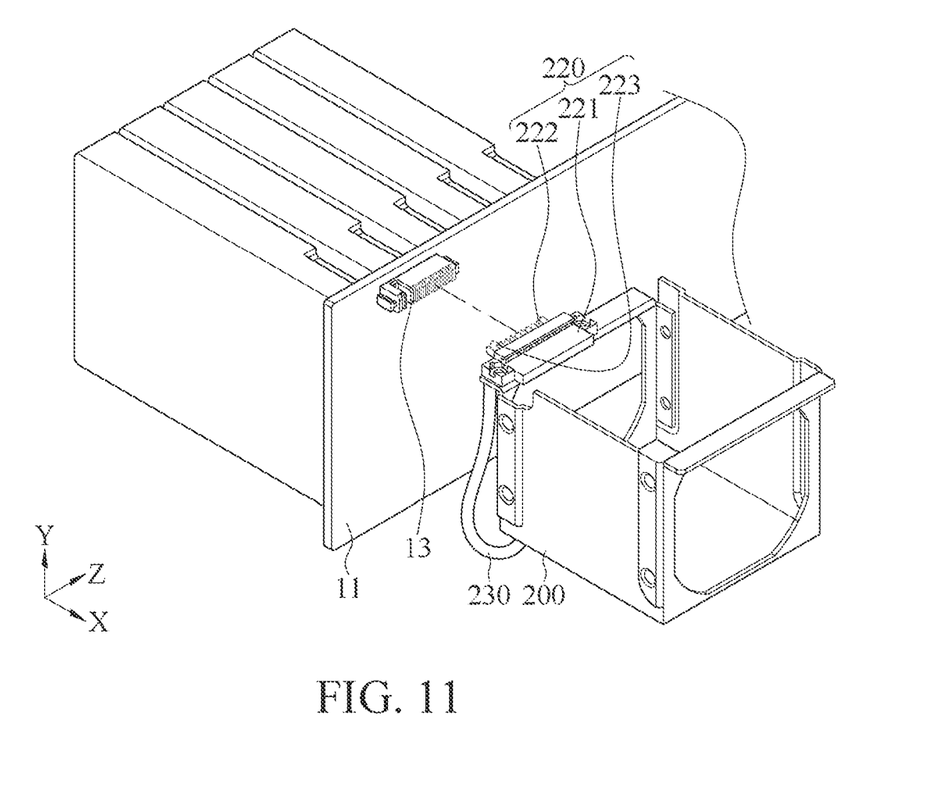
FIG. 11 shows a schematic exploded view of a backplane and a fan frame in a state that the fan frame is provided with a matching connector according to some embodiments.

Referring to FIG. 11, a fan frame 200 is provided, including a matching connector 220. The matching connector 220 is located on a side edge of the fan frame 200 and is adapted to connect to a fan module. The matching connector 220 includes a matching connector body 221, a plurality of matching terminals 222, and a guiding piece 223, the matching terminals 222 are located in the matching connector body 221 and one side of each of the matching terminals 222 is exposed from one side of the matching connector body 221, and the guiding piece 223 is located in the matching connector body 221. In some embodiments, the fan frame 200 is adapted to be mounted in a case with another model and is adapted to bear fan modules with different models, and the matching connector 220 located on the side edge of the fan frame 200 is adapted to connect to the fan module and transmit signals through a signal line 230.

In some embodiments, as shown in FIG. 11, a fan frame 200 may be disposed in a to-be-fitted case 100. In some embodiments, the fan frame may be similar to the fan frame 20 in FIG. 1, and one or more fan frames 200 may be disposed to bear one or more fan modules. In some embodiments, the fan frame may be similar to the fan frame 20 in FIG. 6, and one fan frame 200 is disposed and the fan frame 200 is separated into a plurality of accommodation spaces by using a plurality of partition plates to mount a plurality of fan modules.

In some embodiments, as shown in FIG. 8, the fan frame 200 may include a support structure, and the support structure is located on a bottom side of the fan frame 200. In some embodiments, the support structure is fixed to the bottom side of the fan frame 200 in a locking, soldering, or riveting manner to provide strength to support the fan frame 200.

Based on the above, in some embodiments, according to the plug connector disposed on the backplane and the matching connector disposed on the side edge of the fan module, the user may vertically unplug the fan module from or plug the fan module into the fan frame from a side edge of the backplane along the second axis Y and reserve the operation space between the bottom side of the fan frame body and the bottom side of the shell to provide a horizontal dismounting or mounting walk for the motherboard below the fan module along the first axis X, so that the fan module and the motherboard may be plugged or unplugged independently of each other, and operating of the fan module is not affected when the motherboard is repaired.

What is claimed is:

1. A case, comprising:
    a shell, internally provided with a backplane and a motherboard, the motherboard being connected to the backplane along a first axis, the backplane being connected with a plug connector, the plug connector comprising a plug connector body and a plurality of connection terminals, and the plurality of connection terminals being located in the plug connector body;
    a fan frame, fixed in the shell and located on one side of the motherboard; and
    a fan module, located in the fan frame, the fan module comprising a fan assembly and a matching connector, the matching connector being located on a side edge of the fan assembly and connected to the fan assembly, the matching connector being connected to the plug connector along a second axis, the matching connector comprising a matching connector body and a plurality of matching terminals, the matching connector body further comprises a matching end and an opposite end, the matching end and the opposite end are two ends opposite to each other, the plurality of matching terminals being located in the matching end;
    wherein the plug connector further comprises a plurality of sockets and a matching portion, the plurality of connection terminals are disposed in the plurality of sockets, and the matching portion is located in the plug connector body; and the matching connector further comprises a guiding portion, the guiding portion is located in the matching connector body, and the guiding portion is matched to the matching portion;
    wherein each of the plurality of sockets includes a first side wall, a second side wall and a bearing surface, the first side wall and the second side wall are surfaces opposite to each other, and the bearing surface is matched to the first side wall and the second side wall respectively;
    wherein the fan frame further comprises a support structure, fixed to a bottom side of the fan frame, and the support structure is located between the fan frame and the shell, and located on two sides of the motherboard;
    wherein the plug connector body further comprises a fixing end and a connecting end, the fixing end and the connecting end are two ends opposite to each other, and the plurality of sockets and the matching portion are disposed at the connecting end; the fixing end further comprises a plurality of fixing terminals, the plurality of fixing terminals are exposed from the fixing end, and the plug connector is connected to the backplane of the shell through the plurality of fixing terminals; the fan assembly further comprises a bearing piece and a bearing platform, the bearing piece is fixed to the side edge of the fan assembly, the bearing platform protrudes out from one side of the bearing piece, and the matching connector is fixed to the bearing platform; the plurality of matching terminals and the guiding portion are exposed from the matching end, the opposite end is fixed to the bearing platform and connected to the fan assembly; and the fan frame further comprises a plurality of partition plates separating the fan frame into a plurality of accommodation spaces.

2. The case according to claim 1, wherein a width of each of the plurality of sockets is less than a width of the matching portion, a width of each of the plurality of matching terminals is less than a width of the guiding portion, the guiding portion is a guiding piece, the width of each of the plurality of sockets is approximately equal to the width of each of the plurality of matching terminals, and the width of the guiding portion is approximately equal to the width of the matching portion.

3. The case according to claim 1, wherein the fan assembly further comprises the bearing piece, the bearing platform, and an adapter plate, the bearing piece is fixed to the side edge of the fan assembly, the bearing platform protrudes out from one side of the bearing piece, the adapter plate is fixed to the bearing platform, and the matching connector and a clamping connector are fixed to the adapter plate.

4. The case according to claim 3, wherein the clamping connector comprises a clamping connector body and a plurality of clamping terminals, the plurality of clamping terminals are located in the clamping connector body and one side of each of the plurality of clamping terminals is exposed from one side of the clamping connector body, and an extending direction of the plurality of clamping terminals is perpendicular to an extending direction of the plurality of matching terminals.

* * * * *